United States Patent
Kim et al.

(10) Patent No.: US 9,460,898 B2
(45) Date of Patent: Oct. 4, 2016

(54) PLASMA GENERATION CHAMBER WITH SMOOTH PLASMA RESISTANT COATING

(71) Applicant: Applied Materials, Inc., Santa Clara, CA (US)

(72) Inventors: Sung Je Kim, Santa Clara, CA (US); Soonam Park, Sunnyvale, CA (US); Dmitry Lubomirsky, Cupertino, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 14/820,440

(22) Filed: Aug. 6, 2015

(65) Prior Publication Data

US 2016/0042924 A1 Feb. 11, 2016

Related U.S. Application Data

(60) Provisional application No. 62/035,288, filed on Aug. 8, 2014.

(51) Int. Cl.
| | |
|---|---|
| *H01J 17/26* | (2012.01) |
| *H01J 37/32* | (2006.01) |
| *C23C 14/08* | (2006.01) |
| *C23C 14/28* | (2006.01) |

(52) U.S. Cl.
CPC ....... *H01J 37/32559* (2013.01); *C23C 14/081* (2013.01); *C23C 14/083* (2013.01); *C23C 14/28* (2013.01); *H01J 37/32357* (2013.01); *H01J 37/32422* (2013.01); *H01J 37/32449* (2013.01)

(58) Field of Classification Search
CPC ... H01J 37/32559; C23C 4/02; C04B 41/009
USPC ............ 313/231.31, 231.41, 231.51, 231.61
See application file for complete search history.

(56) References Cited

U.S. PATENT DOCUMENTS

| | | |
|---|---|---|
| 6,949,203 B2 | 9/2005 | Hsieh et al. |
| 6,962,524 B2 | 11/2005 | Butterfield et al. |
| 7,278,911 B2 | 10/2007 | Butterfield et al. |
| 7,422,516 B2 | 9/2008 | Butterfield et al. |
| 7,479,464 B2 | 1/2009 | Sun et al. |
| 7,672,110 B2 | 3/2010 | Sun et al. |
| 7,696,117 B2 | 4/2010 | Sun et al. |
| 8,034,734 B2 | 10/2011 | Sun et al. |
| 8,129,029 B2 | 3/2012 | Sun et al. |
| 8,206,829 B2 | 6/2012 | Sun et al. |
| 8,367,227 B2 | 2/2013 | Sun et al. |
| 8,758,858 B2 | 6/2014 | Sun et al. |
| 9,034,199 B2 | 5/2015 | Duan et al. |
| 9,090,046 B2 | 7/2015 | Sun et al. |
| 9,212,099 B2 | 12/2015 | Sun et al. |

(Continued)

FOREIGN PATENT DOCUMENTS

| | | |
|---|---|---|
| WO | WO2013126466 A1 | 8/2013 |
| WO | WO2013155220 A1 | 10/2013 |

(Continued)

*Primary Examiner* — Vip Patel
(74) *Attorney, Agent, or Firm* — Lowenstein Sandler LLP

(57) ABSTRACT

A faceplate or a selectivity modulation device (SMD) for a plasma generation chamber has a plasma resistant ceramic coating on a surface of the faceplate or SMD, wherein the plasma resistant ceramic coating comprises a thickness of less than approximately 30 microns, a porosity of less than 1% and a thickness non-uniformity of less than 4%.

20 Claims, 7 Drawing Sheets

(56) References Cited

U.S. PATENT DOCUMENTS

| | | |
|---|---|---|
| 2003/0047464 A1 | 3/2003 | Sun et al. |
| 2003/0164354 A1 | 9/2003 | Hsieh et al. |
| 2005/0037193 A1 | 2/2005 | Sun et al. |
| 2005/0284770 A1 | 12/2005 | Butterfield et al. |
| 2007/0047170 A1 | 3/2007 | Sun et al. |
| 2008/0029032 A1 | 2/2008 | Sun et al. |
| 2008/0108225 A1 | 5/2008 | Sun et al. |
| 2008/0213496 A1 | 9/2008 | Sun et al. |
| 2008/0264564 A1 | 10/2008 | Sun et al. |
| 2008/0264565 A1 | 10/2008 | Sun et al. |
| 2009/0036292 A1 | 2/2009 | Sun et al. |
| 2009/0162647 A1 | 6/2009 | Sun et al. |
| 2009/0214825 A1 | 8/2009 | Sun et al. |
| 2010/0119843 A1 | 5/2010 | Sun et al. |
| 2010/0129670 A1 | 5/2010 | Sun et al. |
| 2010/0160143 A1 | 6/2010 | Sun et al. |
| 2011/0198034 A1 | 8/2011 | Sun et al. |
| 2012/0034469 A1 | 2/2012 | Sun et al. |
| 2012/0104703 A1 | 5/2012 | Sun et al. |
| 2012/0125488 A1 | 5/2012 | Sun et al. |
| 2013/0216783 A1 | 8/2013 | Duan et al. |
| 2013/0216821 A1 | 8/2013 | Sun et al. |
| 2013/0224498 A1 | 8/2013 | Sun et al. |
| 2013/0273313 A1 | 10/2013 | Sun et al. |
| 2013/0273327 A1 | 10/2013 | Sun et al. |
| 2013/0284373 A1 | 10/2013 | Sun et al. |
| 2013/0288037 A1 | 10/2013 | Sun et al. |
| 2014/0030486 A1 | 1/2014 | Sun et al. |
| 2014/0030533 A1 | 1/2014 | Sun et al. |
| 2014/0154465 A1 | 6/2014 | Sun et al. |
| 2014/0349073 A1 | 11/2014 | Sun et al. |
| 2014/0363596 A1 | 12/2014 | Sun et al. |
| 2014/0377504 A1 | 12/2014 | Sun et al. |
| 2015/0021324 A1 | 1/2015 | Sun et al. |
| 2015/0024155 A1 | 1/2015 | Sun et al. |
| 2015/0075714 A1 | 3/2015 | Sun et al. |
| 2015/0079370 A1 | 3/2015 | Sun et al. |
| 2015/0133285 A1 | 5/2015 | Sun et al. |
| 2015/0158775 A1 | 6/2015 | Sun et al. |
| 2015/0218057 A1 | 8/2015 | Duan et al. |
| 2015/0270108 A1 | 9/2015 | Sun et al. |
| 2015/0275361 A1 | 10/2015 | Lubomirsky et al. |
| 2015/0275375 A1 | 10/2015 | Kim et al. |
| 2015/0299050 A1 | 10/2015 | Sun et al. |
| 2015/0307982 A1 | 10/2015 | Firouzdor et al. |
| 2015/0311043 A1 | 10/2015 | Sun et al. |
| 2015/0311044 A1 | 10/2015 | Sun et al. |
| 2015/0321964 A1 | 11/2015 | Sun et al. |
| 2015/0329430 A1 | 11/2015 | Sun et al. |
| 2015/0329955 A1 | 11/2015 | Sun et al. |

FOREIGN PATENT DOCUMENTS

| | | |
|---|---|---|
| WO | WO2013162909 A1 | 10/2013 |
| WO | WO2014018830 A1 | 1/2014 |
| WO | WO2014018835 A1 | 1/2014 |
| WO | WO2014190211 A1 | 11/2014 |
| WO | WO2014197203 A1 | 12/2014 |
| WO | WO2014205212 A1 | 12/2014 |
| WO | WO2015009745 A1 | 1/2015 |
| WO | WO2015013070 A1 | 1/2015 |
| WO | WO2015042196 A1 | 3/2015 |
| WO | WO2015073458 A1 | 5/2015 |
| WO | WO2015153123 A1 | 10/2015 |
| WO | WO2015164263 A1 | 10/2015 |
| WO | WO2015164638 A1 | 10/2015 |
| WO | WO2015171801 A1 | 11/2015 |
| WO | WO2015175987 A1 | 11/2015 |

PLASMA GENERATION CHAMBER WITH SMOOTH PLASMA RESISTANT COATING

RELATED APPLICATIONS

This patent application claims the benefit under 35 U.S.C. §119(e) of U.S. Provisional Application No. 62/035,288, filed Aug. 8, 2014.

TECHNICAL FIELD

Embodiments of the present invention relate, in general, to a plasma generation chamber having a smooth thin film plasma resistant protective layer.

BACKGROUND

In the semiconductor industry, devices are fabricated by a number of manufacturing processes producing structures of an ever-decreasing size. Some manufacturing processes such as plasma etch and plasma clean processes expose a substrate to a high-speed stream of plasma to etch or clean the substrate. The plasma may be highly corrosive, and may corrode processing chambers and other surfaces that are exposed to the plasma.

Some plasma etch reactors include a plasma generation chamber that provides plasma to a process chamber of the plasma etch reactor. Traditionally, components of the plasma generation chamber have been coated with coatings having a relatively low uniformity in both thickness and surface roughness. This causes the etch rates for etched wafers to vary from chamber to chamber, and additionally decreases intra-wafer uniformity.

SUMMARY

The following is a simplified summary of embodiments of the disclosure in order to provide a basic understanding of some aspects of the disclosure. This summary is not an extensive overview of the disclosure. It is not intended to delineate any scope of the particular implementations of the disclosure or any scope of the claims. Its sole purpose is to present some concepts of the disclosure in a simplified form as a prelude to the more detailed description that is presented later.

Implementations of the present disclosure relate to plasma generation chamber that includes a faceplate having a first plasma resistant ceramic coating on a surface of the faceplate, wherein the first plasma resistant ceramic coating comprises a thickness of less than approximately 30 microns, a porosity of less than 1% and a thickness non-uniformity of less than 4%. The plasma generation chamber further includes a selectivity modulation device (SMD) having a second plasma resistant ceramic coating on a surface of the SMD, wherein the second plasma resistant ceramic coating comprises a thickness of less than approximately 30 microns, a porosity of less than 1% and a thickness non-uniformity of less than 4%. The plasma generation chamber further includes a dielectric separator separating the faceplate from the selectivity modulation device. The plasma generation chamber is to generate plasma for a processing chamber by accelerating radicals from the faceplate toward the SMD and through a plurality of holes in the SMD.

Implementations of the present disclosure further relate to an article comprising a metal base having a plurality of apertures and a plasma resistant ceramic coating on a surface of the metal base. The plasma resistant ceramic coating has a thickness of approximately 5-30 microns on a surface of the article and a thickness of approximately 1-15 microns on walls of the plurality of apertures. The plasma resistant ceramic coating further has a porosity of less than 1% on the surface of the article and on the walls of the plurality of apertures and a thickness uniformity of at least 96% on the surface of the metal base.

Implementations of the present disclosure further relate to a method comprising performing an ion assisted deposition (IAD) process to deposit a first plasma resistant ceramic coating on a surface of a first article having a first plurality of apertures, the plasma resistant ceramic coating having a thickness of approximately 5-30 microns on a surface of the article and a thickness of approximately 2-15 microns on walls of the first plurality of apertures, the first plasma resistant ceramic coating further having a porosity of less than 1% and a thickness non-uniformity of less than 4% on the surface of the article, wherein the article is one of a faceplate and a selectivity modulation device (SMD).

BRIEF DESCRIPTION OF THE DRAWINGS

The present invention is illustrated by way of example, and not by way of limitation, in the figures of the accompanying drawings in which like references indicate similar elements. It should be noted that different references to "an" or "one" embodiment in this disclosure are not necessarily to the same embodiment, and such references mean at least one.

DETAILED DESCRIPTION OF EMBODIMENTS

Embodiments of the present invention provide a plasma generation chamber including a faceplate and a selectivity modulation device (SMD) that both have a thin film plasma resistant ceramic coating on one or more surfaces. The plasma resistant ceramic coating may provide plasma corrosion resistance for protection of the faceplate and SMD. The plasma resistant ceramic coating may be formed on the article using ion assisted deposition (IAD) or physical vapor deposition (PVD). The thin film protective layer may be $Y_2O_3$, $YF_3$, $Y_3Al_5O_{12}$, $Y_4Al_2O_9$, $Er_2O_3$, $Gd_2O_3$, $Er_3Al_5O_{12}$, $Gd_3Al_5O_{12}$, yttria stabilized zirconium (YSZ), a ceramic compound comprising $Y_4Al_2O_9$ and a solid-solution of $Y_2O_3$—$ZrO_2$, or other ceramic material. The plasma resistant ceramic coating may have a porosity of less than 1%, a thickness of below approximately 30 microns (μm) and a surface roughness of less than about 10 micro-inches. Additionally, the plasma resistant ceramic coating has a variation in surface roughness of about 4 micro-inches (μin) or less and a thickness non-uniformity of about 4 microns or less.

The high density, high thickness uniformity and low surface roughness variation of the plasma resistant ceramic coatings provides high process stability and consistency between different plasma generation chambers. Each plasma generation chamber may include a different SMD and faceplate with the same plasma resistant ceramic coatings. Due to the high thickness uniformity and low surface roughness variation in the plasma resistant ceramic coatings, the etch rates associated with the different plasma generation chambers varies by less than 5%, and by less than 3% in some embodiments. Additionally, the high thickness uniformity and low surface roughness variation cause etched wafers to have a surface uniformity of approximately 95%-97%. Thus, embodiments enable etch reactors to satisfy tightened customer specifications in etch rate consistency.

Figure 1:
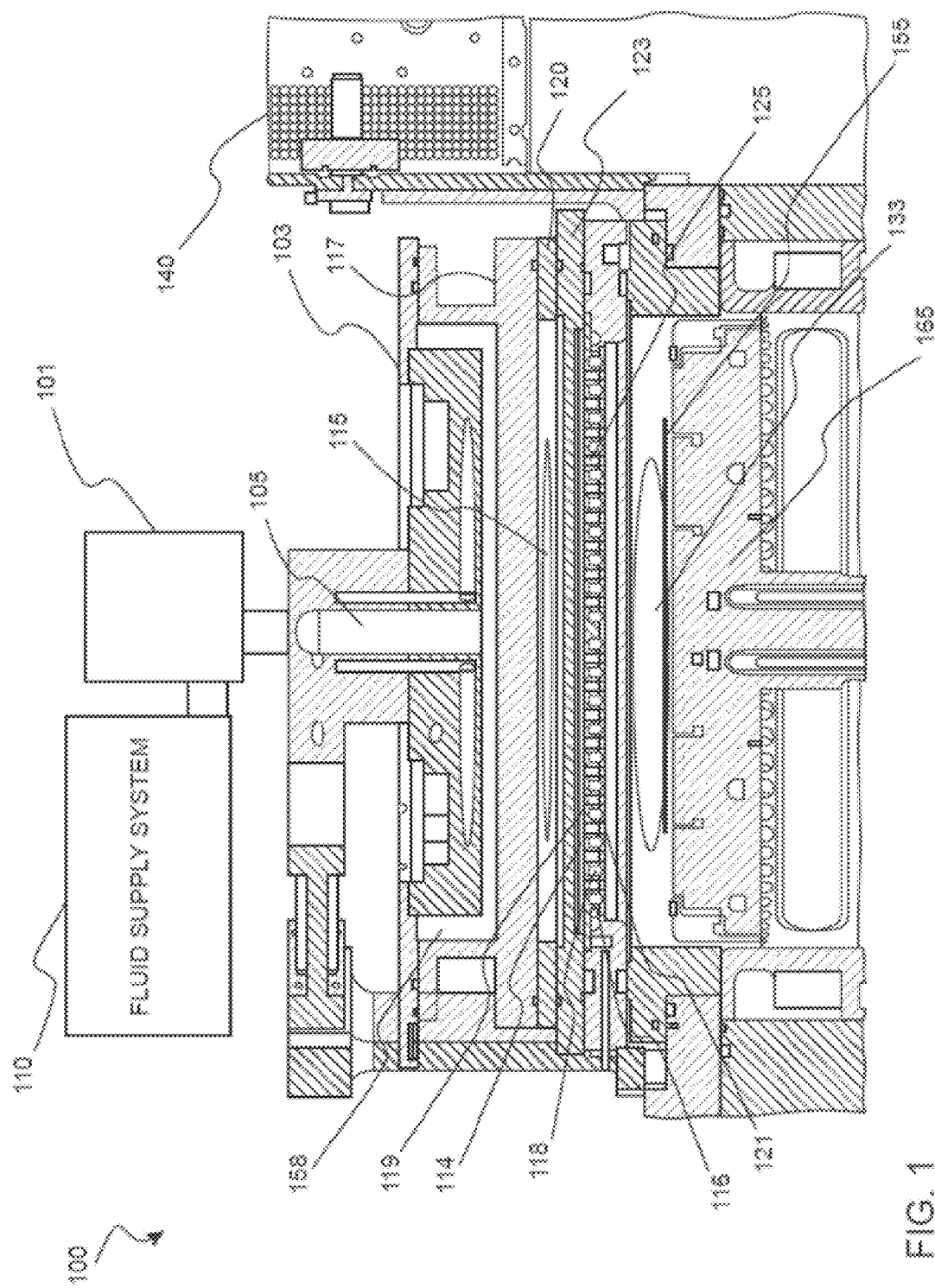
FIG. 1 shows a cross-sectional side view of one embodiment of a processing chamber.

FIG. 1 is a cross-sectional side view of a semiconductor processing system 100 having a faceplate 117 and an SMD 123 that are coated with a thin film plasma resistant ceramic coating in accordance with embodiments of the present invention. The processing system 100 may be used for processes in which a corrosive plasma environment is provided. The thin film plasma resistant ceramic coating, which is described in greater detail below, may include $Y_3Al_5O_{12}$ (YAG), $Y_4Al_2O_9$ (YAM), $Er_2O_3$, $YF_3$, $Gd_2O_3$, $Er_3Al_5O_{12}$ (EAG), $Gd_3Al_5O_{12}$ (GAG), YSZ and/or a ceramic compound comprising $Y_4Al_2O_9$ and a solid-solution of $Y_2O_3$—$ZrO_2$. The thin film plasma resistant ceramic coating may also include $Y_2O_3$ and $Y_2O_3$ based ceramics, $Er_2O_3$ based ceramics, $Gd_2O_3$ based ceramics, and other rare earth oxides. The thin film plasma resistant ceramic coating may be an IAD or PVD coating applied over a metal substrate such as Al, Ti, stainless steel, or anodized Al.

Processing system 100 includes a processing chamber partitioned into a plasma generation chamber 115 or region and a substrate processing region 133 or chamber. Plasma generation chamber 115 includes a faceplate 117, a selectivity modulation device (SMD) 123 (also referred to as an ion suppressor) and a dielectric spacer 120 that separates the SMD 123 from the faceplate 117. During film etching of layers such as titanium nitride, tantalum nitride, tungsten, silicon, polysilicon, silicon oxide, silicon nitride, silicon oxynitride, silicon oxycarbide, etc., a process gas may be flowed into the plasma generation chamber 115 through a gas inlet assembly 105. A remote plasma system (RPS) 101 may optionally be included in the system, and may process a first gas which then travels through gas inlet assembly 105. The inlet assembly 105 may include two or more distinct gas supply channels where the second channel (not shown) may bypass the RPS 101, if included.

A cooling plate 103, showerhead 125 and substrate support 165 are shown and may each be included according to embodiments. The substrate support 165 supports a substrate 155 such as a wafer during processing. Processing system 100 may additionally include a pedestal 165. The pedestal 165 may have a heat exchange channel through which a heat exchange fluid flows to control a temperature of the substrate 155. The pedestal 165 may include a wafer support platter, which may be made of aluminum, ceramic, or a combination thereof. The wafer support platter may be resistively heated in order to achieve relatively high temperatures, such as up to or about 100° C. to about 1100° C., using an embedded resistive heater element.

The faceplate 117 may be pyramidal, conical, or of another similar structure with a narrow top portion expanding to a wide bottom portion. The faceplate 117 may additionally be flat as shown and include multiple apertures used to distribute process gases. The faceplate 117 may include an IAD deposited plasma resistant ceramic coating on a plasma facing surface of the faceplate 117. Additionally, walls of the multiple apertures in the faceplate 117 may also be coated by the IAD deposited plasma resistant ceramic coating. Plasma generating gases and/or plasma excited species, depending on use of the RPS 101, may pass through the apertures in faceplate 117 for uniform delivery into the plasma generation chamber 115.

In some configurations the gas inlet assembly 105 may open into a gas supply region 158 partitioned from the plasma generation chamber 115 by faceplate 117 so that the gases/species flow through the holes or apertures in the faceplate 117 into the plasma generation chamber 115. Structural and operational features may be selected to prevent significant backflow of plasma from the plasma generation chamber 115 back into the supply region 158, gas inlet assembly 105, and fluid supply system 110.

Dielectric spacer 120 may be an insulating ring that allows an alternating current (AC) potential to be applied to the faceplate 117 relative to the SMD 123. The dielectric spacer 120 may be positioned between the faceplate 117 and the SMD 123 to enable a capacitively coupled plasma (CCP) to be formed in the plasma generation chamber 115. A baffle (not shown) may additionally be located in the plasma generation chamber 115, or otherwise coupled with gas inlet assembly 105, to affect the flow of fluid into the plasma generation chamber 115 through gas inlet assembly 105.

The SMD 123 may include a plate, base or other geometry that defines multiple apertures throughout the SMD 123. The multiple apertures are configured to suppress the migration of ionically charged species out of the plasma generation chamber 115 while allowing uncharged neutral or radical species to pass through the SMD 123 into an activated gas delivery region between the SMD 123 and the showerhead 125. In embodiments, the SMD 123 may include a perforated plate with a variety of aperture configurations. The SMD 123 may include an IAD deposited plasma resistant ceramic coating on a plasma facing surface of the SMD 123. Additionally, walls of the multiple apertures in the SMD 123 may also be coated by the IAD deposited plasma resistant ceramic coating.

The uncharged species that flow through the apertures of the SMD 123 may include highly reactive species that are transported with a small amount of reactive carrier gas. As noted above, the migration of ionic species through the holes may be reduced, and in some instances completely suppressed by the SMD 123. Controlling the amount and types of ionic species and/or radical species passing through the SMD 123 may advantageously provide increased control over the gas mixture brought into contact with the underlying substrate 155 (e.g., a wafer), which in turn may increase control of deposition and/or etch characteristics of the gas mixture. For example, adjustments in the ion concentration of the gas mixture can significantly alter etch selectivity. For example, TiNx:SiOx etch ratios, TiN:W etch ratios, SiN:Si etch ratios, SiN:$O_2$ etch ratios, and other etch ratios may be controlled.

The apertures in the SMD 123 may be configured to control the passage of the activated gas, i.e., the ionic, radical, and/or neutral species, through the SMD 123. For example, the aspect ratio of the holes (hole diameter to length) and/or the geometry of the holes may be controlled so that the flow of ionically-charged species in the activated gas passing through the SMD 123 is reduced. The holes in the SMD 123 may include a tapered portion that faces an inside of the plasma generation chamber 115, and a cylindrical portion that faces the showerhead 125. The cylindrical portion may be shaped and dimensioned to control the flow of ionic species passing to the showerhead 125. An adjustable electrical bias may also be applied to the SMD 123 for additional control of the flow of ionic species through the SMD 123.

The SMD 123 may function to reduce or eliminate the amount of ionically charged species traveling from the plasma generation region to the substrate. Uncharged neutral and radical species may still pass through the openings in the SMD 123 to react with the substrate. It should be noted that the complete elimination of ionically charged species in the reaction region surrounding the substrate 155 may not be performed in some embodiments. In certain instances, ionic species are intended to reach the substrate in order to perform the etch and/or deposition process. In these instances, the SMD 123 may help to control the concentration of ionic species in the reaction region at a level that assists the process.

Showerhead 125 in combination with SMD 123 may allow a plasma present in plasma generation chamber 115 to avoid directly exciting gases in a substrate processing region 133, while still allowing excited species to travel from plasma generation chamber 115 into substrate processing region 133. For example, the processing system 100 may be configured to prevent the plasma from contacting a substrate 155 being etched. This may advantageously protect a variety of intricate structures and films patterned on the substrate, which may be damaged, dislocated, or otherwise warped if directly contacted by a generated plasma. Additionally, when plasma is allowed to contact the substrate 155 or approach the substrate level, the rate at which oxide species etch may increase. Accordingly, if an exposed region of material is oxide, this material may be further protected by maintaining the plasma remotely from the substrate 155.

The processing system 100 may further include a power supply 140 electrically coupled with the processing chamber to provide electric power to the faceplate 117, SMD 123, showerhead 125, and/or pedestal 165 to generate a plasma in the plasma generation chamber 115 or processing region 133. The power supply 140 may be configured to deliver an adjustable amount of power to the chamber depending on the process performed. Such a configuration may allow for a tunable plasma to be used in the processes being performed. Unlike a remote plasma unit, which is often presented with on or off functionality, a tunable plasma may be configured to deliver a specific amount of power to the plasma generation chamber 115. This in turn may allow development of particular plasma characteristics such that precursors may be dissociated in specific ways to enhance the etching profiles produced by these precursors.

A plasma may be ignited either in plasma generation chamber 115 above showerhead 125 or in substrate processing region 133 below showerhead 125. Plasma may be present in plasma generation chamber 115 to produce the radical precursors from an inflow of, for example, a fluorine containing precursor or other precursor. An AC voltage typically in the radio frequency (RF) range may be applied between faceplate 117 and SMD 123 to ignite a plasma in plasma generation chamber 115 during deposition. An RF power supply may generate a high RF frequency of 13.56 MHz but may also generate other frequencies alone or in combination with the 13.56 MHz frequency.

In some embodiments, substrate 155 includes layers of SiN, $O_2$ and silicon (e.g., polysilicon), and processing system 100 is to perform an etch process to selectively etch the SiN, To achieve such a selective etch, in one embodiment fluid supply system 110 supplies a combination of $NF_3$ gas and $N_2O$ gas. The $NF_3$ gas supplies an F radical for etching the SiN layer from the substrate 155 and the $N_2O$ gas supplies an O radical for protection of the $O_2$ and the Si layers from being etched. For such a process, careful control of the ratio of the F radicals to the O radicals enables controlled selectivity between the SiN and $O_2$ or S.

SMDs and faceplates may be coated with a $Y_2O_3$ (yttria) plasma sprayed plasma resistant ceramic coating to protect the SMDs and faceplates from ion bombardment. However, a certain percentage of O radicals that impact the $Y_2O_3$ coating pick up an extra Oxygen molecule and transition to $O_2$. This reduces the number of available O radicals and thus changes the ratio of F radicals to O radicals, which in turn changes both the selectivity and the etch rate of $O_2$ and S on substrates. The amount of O radicals that convert to $O_2$ is dependent on the surface area and to a lesser extent the porosity of the $Y_2O_3$ coating. This conversion of O radicals to $O_2$ is characterized by the following equations:

$$O \rightarrow O(s) \overset{k_f}{\rightarrow} O_2 \qquad (1)$$

$$k_f = \gamma \Gamma^m \sqrt{\frac{RT}{2\pi W}} \qquad (2)$$

Where $k_f$ is a reaction rate constant, $\gamma$ is a sticking coefficient of the O radicals, $\Gamma$ is the total surface area of the coating, m is a surface coefficient, R is a universal gas constant, T is temperature, and W is molecular weight.

Plasma sprayed ceramic coatings typically have a high porosity of between about 4-10%, a thickness of about 100-200 microns, and a high surface roughness of about 125-170 μin with a standard deviation of about 10 μin. Additionally, plasma sprayed plasma resistant ceramic coatings have a high variation in surface roughness of about 45 μin and a variation in coating thickness of about 20% (e.g., a variation of around 30 microns). As is shown in the above equations, the large variation in thickness and in surface roughness causes a large variation in the amount of O radicals that are converted to $O_2$. Accordingly, the large variation in thickness and surface roughness causes a large variation of approximately 30% in etch rates and in selectivity from component to component and thus from chamber to chamber. Additionally, the large variation in thickness and surface roughness may cause uniformity of etched substrates to be about 80%.

As mentioned, plasma facing surfaces of the SMD 123 and the faceplate 117 are coated with an IAD or PVD deposited plasma resistant ceramic coating in embodiments. In one embodiment, the IAD deposited plasma resistant ceramic coating is an IAD deposited $Y_2O_3$ coating. Alternatively, other ceramics may be used. The IAD or PVD deposited ceramic coating may have a thickness of below approximately 30 microns (μm) and a surface roughness of less than about 10 μin with a standard deviation of about 1 μin. Additionally, the plasma resistant ceramic coating has a variation in surface roughness of about 4 micro-inches (μin) or less and a thickness non-uniformity of about 3% or less (e.g., about 4 microns or less). This high thickness uniformity and low variation in surface roughness causes a consistent amount of O radicals to be transformed to $O_2$. As a result, the etch rate and selectivity between parts and chambers is consistent to within 5%. In one embodiment, the etch rate and selectivity between parts and chambers is consistent to within 3%. Moreover, the intra-wafer uniformity of substrates etched using SMDs and faceplates manufactured in accordance with embodiments is about 95%-97%.

Figure 2:
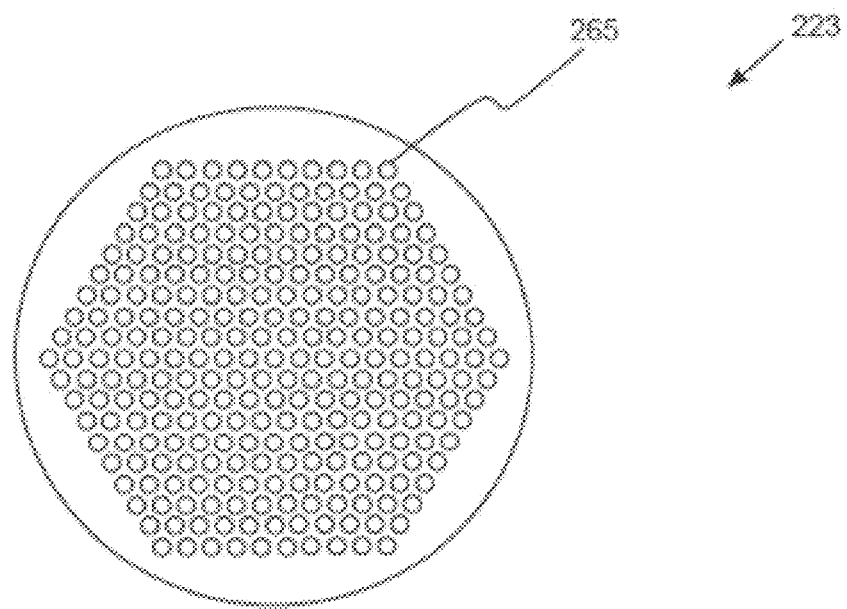
FIG. 2 shows a plan view of a selectivity modulation device (SMD) according to one embodiment.

FIG. 2 shows a plan view of a selectivity modulation device (SMD) 223 according to one embodiment. SMD 223 corresponds with SMD 123 shown in FIG. 1. SMD 223 may have a disc shape. SMD 223 may be a conductive material such as a metal including aluminum, as well as other conductive materials that allow the SMD 223 to serve as an electrode for use in a plasma arrangement as previously described. The SMD 223 may be of a variety of thicknesses, and may include multiple apertures 265 defined within the SMD 223. The apertures 265 may be arranged in a series of rings of apertures in a geometric pattern, such as a hexagon as shown. The pattern illustrated is exemplary and it is to be understood that a variety of patterns, hole arrangements, and hole spacing are encompassed in the design.

The apertures 265 may be sized or otherwise configured to allow fluids to be flowed through the apertures 265 during operation. The apertures 265 may be sized less than about 2 inches in various embodiments, and may be less than or about 1.5 inches, about 1 inch, about 0.9 inches, about 0.8 inches, about 0.75 inches, about 0.7 inches, about 0.65 inches, about 0.6 inches, about 0.55 inches, about 0.5 inches, about 0.45 inches, about 0.4 inches, about 0.35 inches, about 0.3 inches, about 0.25 inches, about 0.2 inches, about 0.15 inches, about 0.1 inches, about 0.05 inches, etc. or less. Apertures 265 may control and affect the flow of radicals, ions and/or precursors through the SMD 223. A surface of the SMD 223 and walls of the apertures 265 are coated with a plasma resistant ceramic coating in accordance with embodiments described herein.

Figure 3:
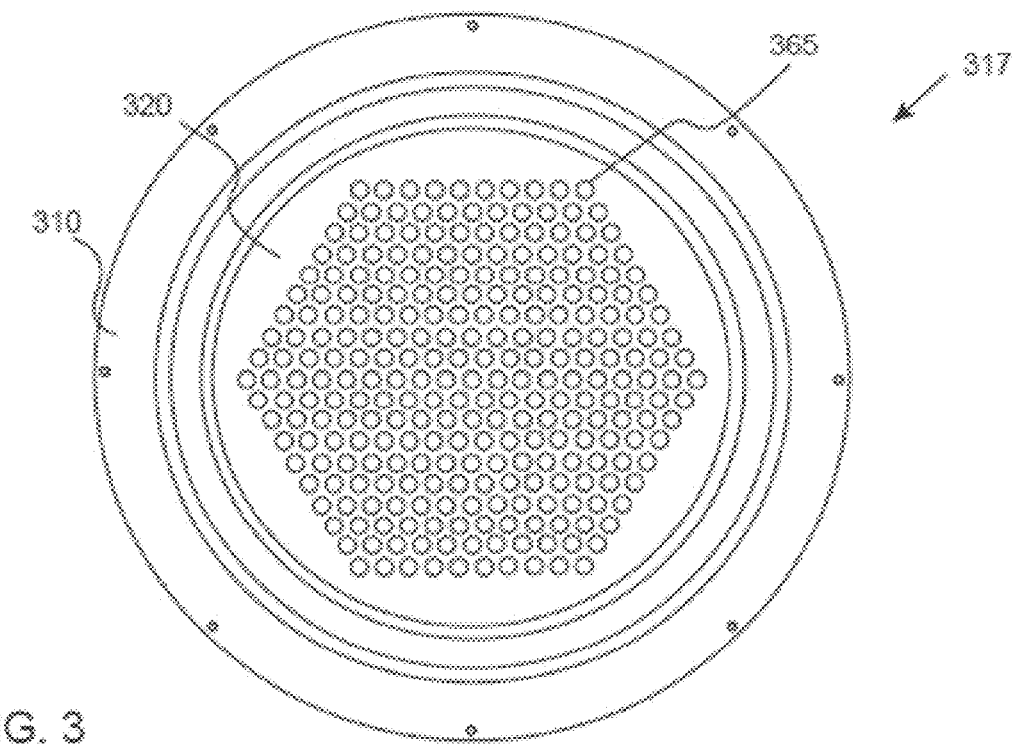
FIG. 3 shows a plan view of a faceplate according to one embodiment.

FIG. 3 shows a plan view of a faceplate 317 according to one embodiment. Faceplate 317 corresponds with faceplate 117 shown in FIG. 1. As shown, the faceplate 317 may comprise a perforated plate or manifold. The assembly of the faceplate 317 may be similar to the SMD as shown in FIG. 2, or may include a design configured specifically for distribution patterns of precursor gases. Faceplate 317 may include an annular frame 310 positioned in various arrangements within an exemplary processing chamber, such as the chamber as shown in FIG. 1. A base or plate 320 may be coupled to the annular frame 310. In embodiments faceplate 317 may be a single-piece design where the frame 310 and plate 310 are a single piece of material.

The base or plate 320 may have a disc shape and be seated on or within the frame 310. The base or plate 320 may be a conductive material such as a metal including aluminum, as well as other conductive materials that allow the plate to serve as an electrode for use in a plasma arrangement as previously described. The plate 320 may be of a variety of thicknesses, and may include multiple apertures 365 defined within the plate 320. An exemplary arrangement as shown in FIG. 3 may include a pattern as previously described with reference to the arrangement in FIG. 2, and may include a series of rings of apertures in a geometric pattern, such as a hexagon as shown. The pattern illustrated is exemplary and it is to be understood that a variety of patterns, hole arrangements, and hole spacing are encompassed in the design.

The apertures 365 may be sized or otherwise configured to allow fluids to be flowed through the apertures 365 during operation. The apertures 365 may be sized less than about 2 inches in various embodiments, and may be less than or about 1.5 inches, about 1 inch, about 0.9 inches, about 0.8 inches, about 0.75 inches, about 0.7 inches, about 0.65 inches, about 0.6 inches, about 0.55 inches, about 0.5 inches, about 0.45 inches, about 0.4 inches, about 0.35 inches, about 0.3 inches, about 0.25 inches, about 0.2 inches, about 0.15 inches, about 0.1 inches, about 0.05 inches, etc. or less.

Figure 4:
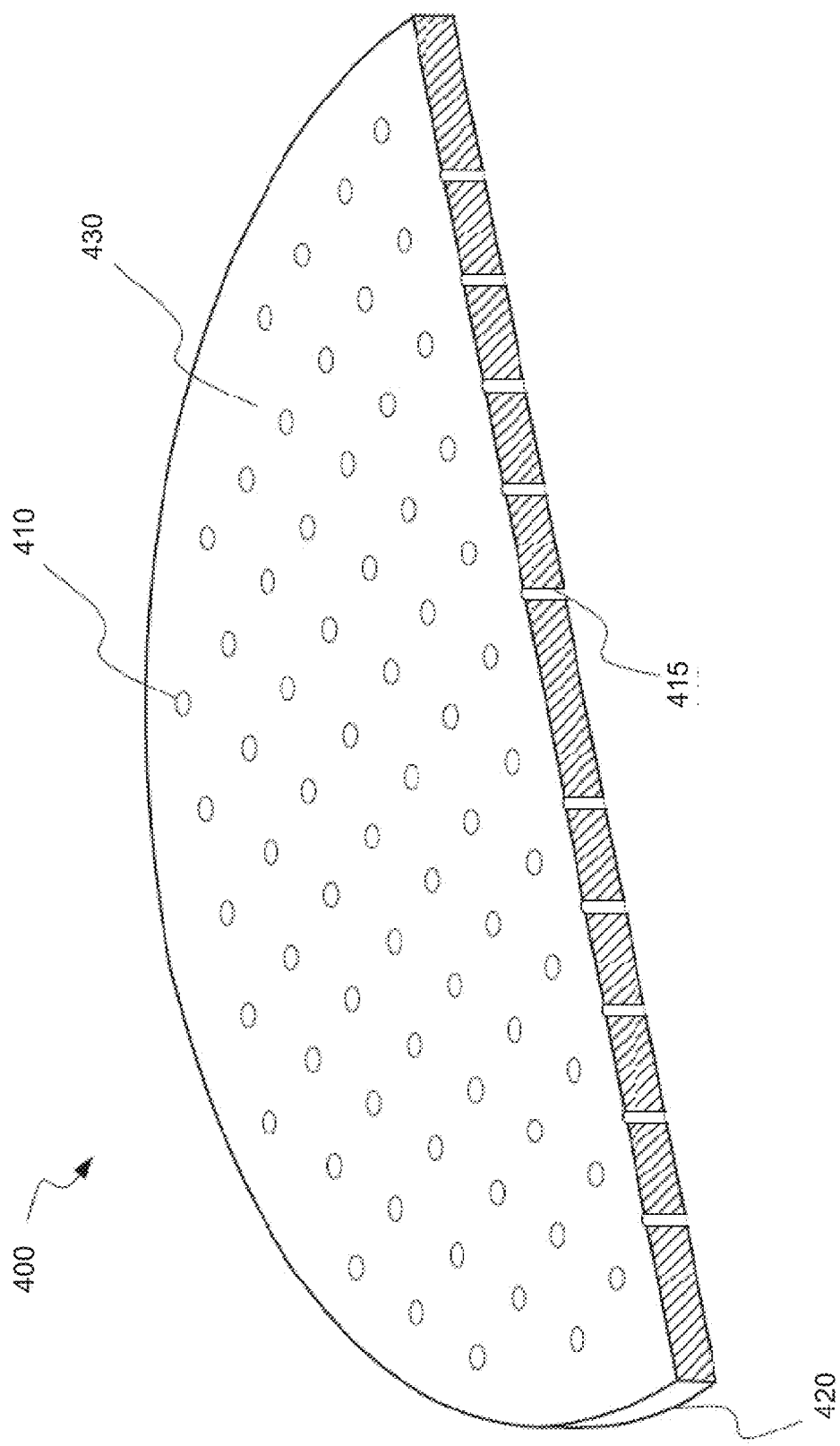
FIG. 4 shows a cross-sectional view of an article in accordance with one embodiment.

FIG. 4 shows a cross-sectional view of an article 400 in accordance with one embodiment. The article may be an SMD or faceplate that includes a conductive plate 420 that defines multiple apertures 410 (e.g., thousands of apertures in some embodiments). The article 400 further includes an IAD deposited plasma resistant ceramic coating 430 on a surface of the conductive plate 420 and on at least a portion of interior walls 415 defining each of the apertures 410.

Figure 5:
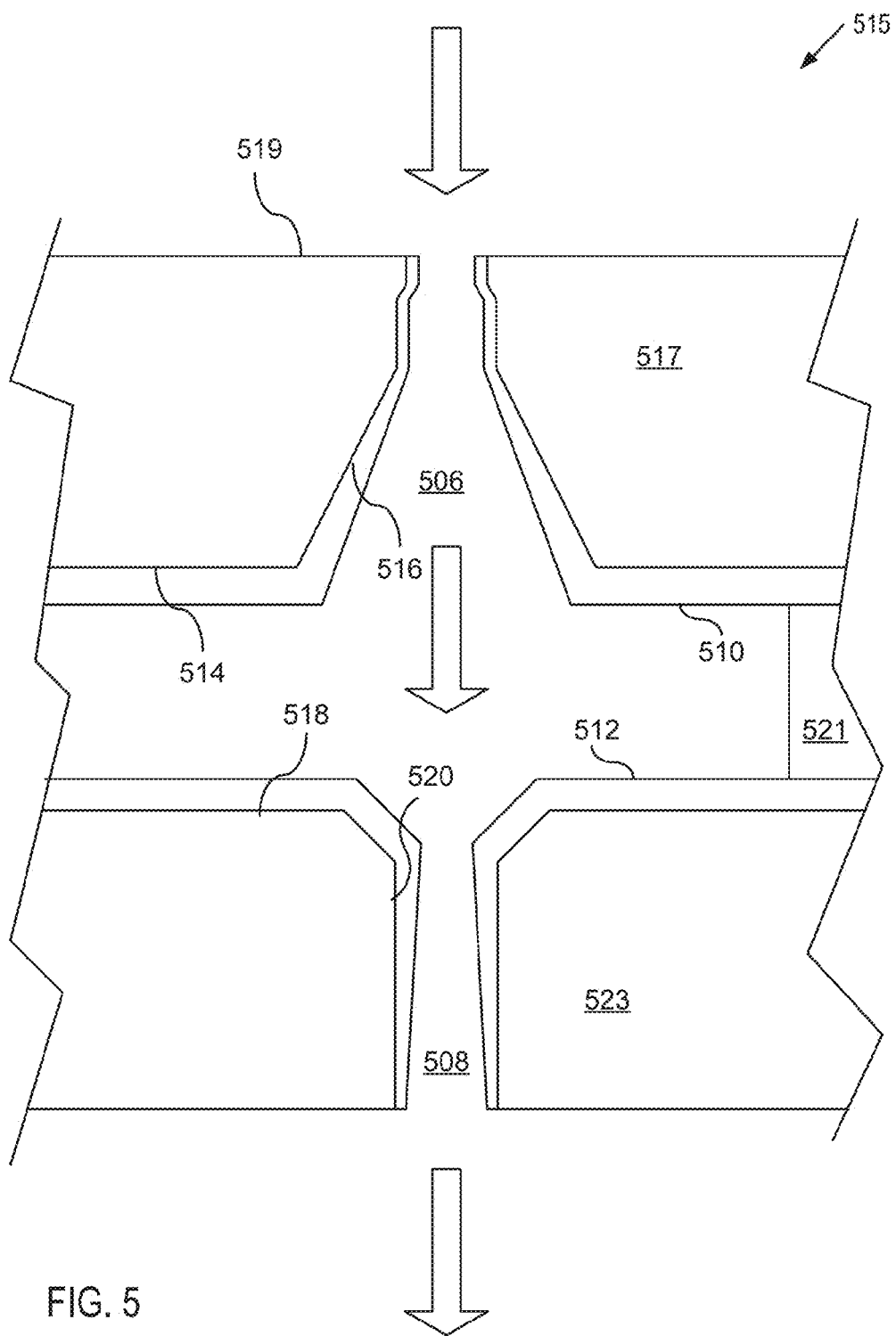
FIG. 5 shows a cross-sectional side view of one embodiment of a plasma generation chamber.

FIG. 5 shows a cross-sectional side view of one embodiment of a plasma generation chamber 515 corresponding to plasma generation chamber 115 of FIG. 1. Plasma generation chamber 515 includes a faceplate 517 separated from an SMD 523 by a dielectric spacer 521.

Faceplate 517 includes multiple apertures of which aperture 506 is shown. An IAD deposited plasma resistant ceramic coating 510 coats a plasma facing surface 514 of the faceplate 517. Additionally, the IAD deposited plasma resistant ceramic coating 510 coats walls 516 of the aperture 506. A thickness of the IAD deposited plasma resistant ceramic coating 510 on the surface 514 may have a thickness of about 3-30 microns with a thickness variation of about 4% or less. In one embodiment, the IAD deposited plasma resistant ceramic coating 510 has a thickness of about 8 microns on the surface 514 with a thickness variation of +/−2% (e.g., a variation of 0.32 microns).

A thickness of the IAD deposited plasma resistant ceramic coating 510 on the walls 516 of the aperture 506 may be about 1-15 microns. In one embodiment, the thickness of the plasma resistant ceramic coating 510 decreases as the depth of the aperture 506 increases. In the embodiment in which the plasma resistant ceramic coating 510 has a thickness of 8 microns on the surface 514, a thickness of the plasma resistant ceramic coating 510 about half way into the aperture 506 is about 4 microns and a thickness of the plasma resistant ceramic coating 510 on the walls 516 of the aperture furthest from the plasma facing surface 514 is about 1 micron. In one embodiment, a semi-line-of-sight IAD deposition process is performed to enable the aperture 506 to be completely coated. Thus, even portions of the wall 516 that are outside a line-of-sight of a deposition source still obtain some coating (e.g., a 1 micron thick coating).

SMD 523 also includes multiple apertures of which aperture 508 is shown. An IAD deposited plasma resistant ceramic coating 512 coats a plasma facing surface 518 of the SMD 523. Additionally, the IAD deposited plasma resistant ceramic coating 512 coats walls 520 of the aperture 508. A thickness of the IAD deposited plasma resistant ceramic coating 512 on the surface 518 may have a thickness of about 3-30 microns with a thickness variation of about 4% or less. In one embodiment, the IAD deposited plasma resistant ceramic coating 512 has a thickness of about 8 microns on the surface 518 with a thickness variation of +/−2% (e.g., a variation of 0.32 microns).

A thickness of the IAD deposited plasma resistant ceramic coating 512 on the walls 520 of the aperture 508 may be about 1-15 microns. In one embodiment, the thickness of the plasma resistant ceramic coating 512 decreases as the depth of the aperture 508 increases. In the embodiment in which the plasma resistant ceramic coating 512 has a thickness of 8 microns on the surface 518, a thickness of the plasma resistant ceramic coating 512 about half way into the aperture 508 is about 4 microns and a thickness of the plasma resistant ceramic coating 512 on the walls 520 of the aperture furthest from the plasma facing surface 518 is about 1 micron. In one embodiment, a semi-line-of-sight IAD deposition process is performed to enable the aperture 508 to be completely coated. Thus, even portions of the wall 520 that are outside a line-of-sight of a deposition source still obtain some coating (e.g., a 1 micron thick coating).

As shown, the plasma resistant ceramic coatings 510, 512 formed on bodies of the faceplate 517 and SMD 523 may conform to the surfaces features of bodies. As shown, the plasma resistant ceramic coating is a conformal layer that maintains a relative shape of the faceplate 517 and SMD 523.

The plasma resistant ceramic coatings 510, 512 may be deposited thin film ceramic layers that may be formed using an ion assisted deposition (IAD) process or a physical vapor deposition (PVD) process. One example IAD process that may be performed is electron beam ion assisted deposition (EB-IAD). The IAD or PVD deposited coatings 510, 512 may have a relatively low film stress (e.g., as compared to a film stress caused by plasma spraying or sputtering). The IAD or PVD deposited coatings 510, 512 may additionally have a porosity that is less than 1%, and less than about 0.1% in some embodiments. Therefore, the IAD or PVD deposited plasma resistant ceramic coating is a dense structure, which can have performance benefits for application on a chamber component. Additionally, the IAD or PVD deposited plasma resistant ceramic coatings 510, 512 may be deposited without first roughening the plasma facing surfaces 514, 518 or performing other time consuming surface preparation steps. In one embodiment, surfaces 514, 518 are lapped or otherwise polished to a surface roughness of less than 32 μin before the coatings 510, 512 are deposited. In one embodiment, the surfaces 514, 518 are polished to a roughness of about 4-8 μin. In one embodiment, walls of the apertures 506, 508 are also polished to a roughness of less than 32 μin before the coatings 510, 512 are deposited. In one embodiment, the walls are polished to a roughness of about 4-8 μin.

Examples of ceramics that may be used to form the plasma resistant ceramic coatings 510, 512 include $Y_2O_3$, $YF_3$, $Y_3Al_5O_{12}$, $Y_4Al_2O_9$, $Er_2O_3$, $Gd_2O_3$, $Er_3Al_5O_{12}$, $Gd_3Al_5O_{12}$, YSZ, or a ceramic compound comprising $Y_4Al_2O_9$ and a solid-solution of $Y_2O_3$—$ZrO_2$. Other Y based, Er based and/or Gd based plasma resistant rare earth oxides may also be used to form the coatings 510, 512. In one embodiment, the ceramic compound includes 62.93 mol % $Y_2O_3$, 23.23 mol % $ZrO_2$ and 13.94 mol % $Al_2O_3$. In another embodiment, the ceramic compound can include $Y_2O_3$ in a range of 50-75 mol %, $ZrO_2$ in a range of 10-30 mol % and $Al_2O_3$ in a range of 10-30 mol %. In other embodiments, other distributions may also be used for the ceramic compound. Any of the aforementioned ceramics may include trace amounts of other materials such as $ZrO_2$, $Al_2O_3$, $SiO_2$, $B_2O_3$, $Er_2O_3$, $Nd_2O_3$, $Nb_2O_5$, $CeO_2$, $Sm_2O_3$, $Yb_2O_3$, or other oxides.

Figure 6:
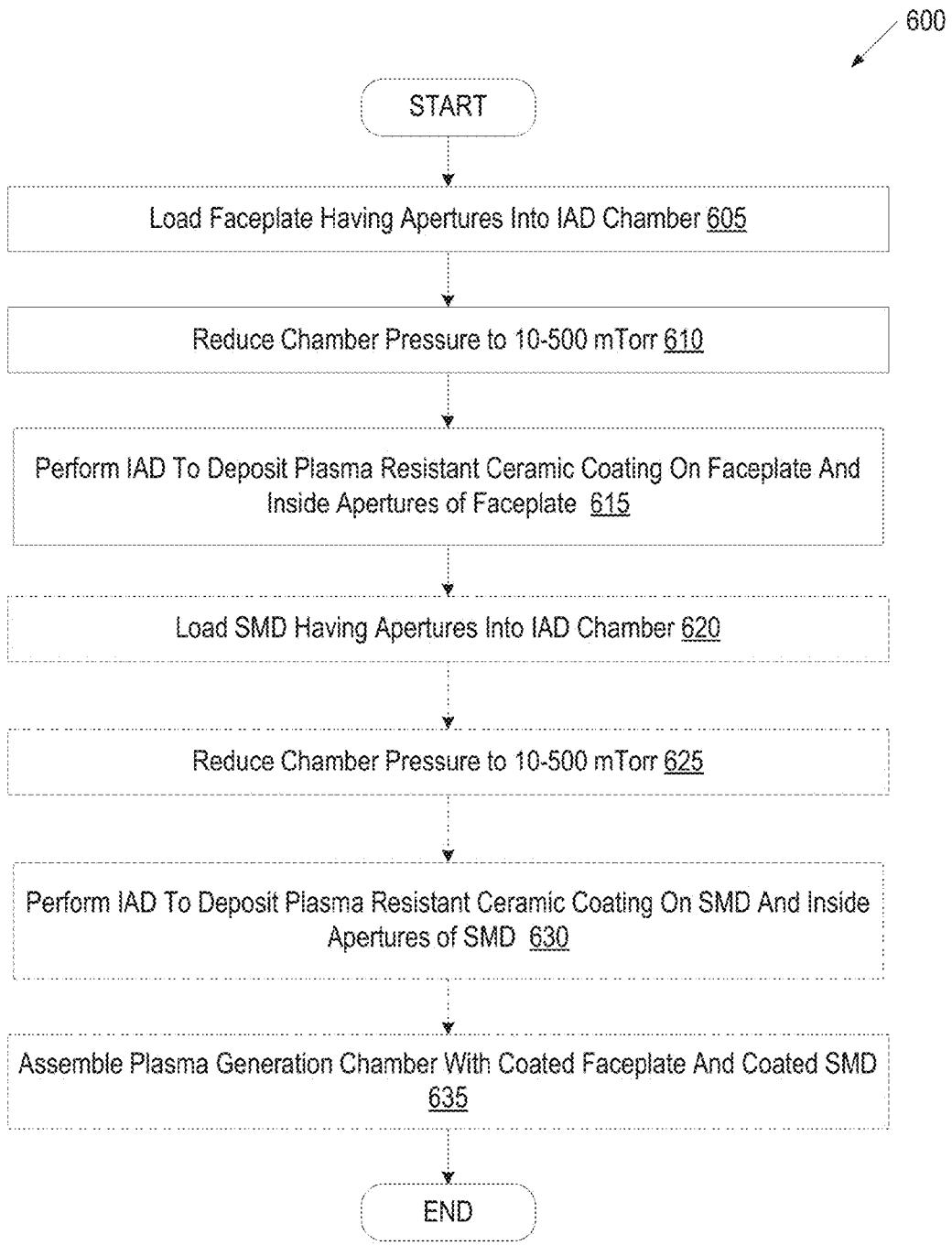
FIG. 6 illustrates one embodiment of a process for forming a plasma resistant ceramic coating over an SMD and faceplate.

FIG. 6 illustrates one embodiment of a process 600 for forming a plasma resistant ceramic coating over an SMD and faceplate. At block 605 of process 600, a faceplate is loaded into an IAD chamber. The faceplate may include a metal body such as an aluminum or aluminum alloy body that includes a large number of through apertures. At block 610, a pressure of the IAD chamber is reduced to about 10-500 mTorr. In one embodiment, the pressure of the IAD chamber is reduced to about 100 mTorr. An IAD process performed at this pressure is a semi-line-of-sight process.

At block 615, IAD is performed to deposit a plasma resistant ceramic coating on the body of the article. Alternatively, PVD may be performed. The plasma resistant ceramic coating may be $Y_2O_3$, $YF_3$, YSZ, $Y_3Al_6O_{12}$, $Y_4Al_2O_9$, $Er_2O_3$, $Gd_2O_3$, $Er_3Al_6O_{12}$, $Gd_3Al_6O_{12}$, the ceramic compound of $Y_4Al_2O_9$ and a solid-solution of $Y_2O_3$—$ZrO_2$, or any of the other ceramic materials discussed herein. A deposition rate for the plasma resistant ceramic coating may be about 1-8 Angstroms per second, and may be varied by tuning deposition parameters. The plasma resistant ceramic coating may be very conforming, may be uniform in thickness, and have a good adhesion to the body/substrate that it is deposited on. Additionally, the plasma resistant ceramic coating may have a low and uniform surface roughness, a low porosity, and a uniform thickness.

The operations of blocks 620-635 may be performed or omitted. At block 620 of process 600, an SMD may be loaded into an IAD chamber. The SMD may include a metal body such as an aluminum or aluminum alloy body that includes a large number of through apertures. At block 625, a pressure of the IAD chamber may be reduced to about 10-500 mTorr. In one embodiment, the pressure of the IAD chamber is reduced to about 100 mTorr.

At block 630, IAD may be performed to deposit a plasma resistant ceramic coating on the body of the article. Alternatively, PVD may be performed. The plasma resistant ceramic coating may be $Y_2O_3$, YSZ, $Y_3Al_6O_{12}$, $Y_4Al_2O_9$, $Er_2O_3$, $Gd_2O_3$, $Er_3Al_6O_{12}$, $Gd_3Al_6O_{12}$, the ceramic compound of $Y_4Al_2O_9$ and a solid-solution of $Y_2O_3$—$ZrO_2$, or any of the other ceramic materials discussed herein.

At block 635, a plasma generation chamber may be assembled using the coated faceplate and the coated SMD. The plasma generation chamber may provide an etch rate that varies from etch rates of other similarly manufactured plasma generation chambers by less than 3%.

Figure 7A:
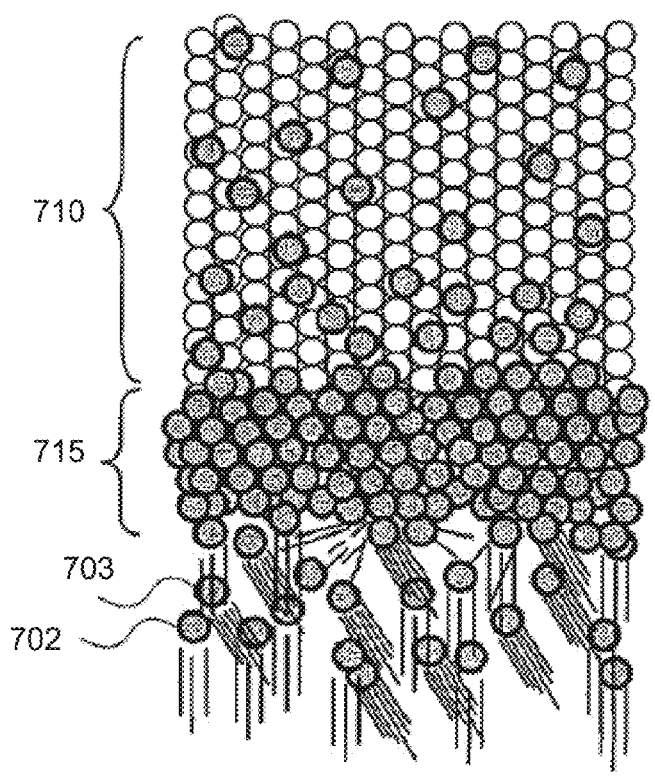
FIG. 7A depicts a deposition mechanism applicable to a variety of deposition techniques utilizing energetic particles such as ion assisted deposition (IAD).

FIG. 7A depicts a deposition mechanism applicable to a variety of deposition techniques utilizing energetic particles such as ion assisted deposition (IAD). Exemplary IAD methods include deposition processes which incorporate ion bombardment, such as evaporation (e.g., activated reactive evaporation (ARE)), electron beam (e-beam) IAD, and sputtering in the presence of ion bombardment to form plasma resistant coatings as described herein. Any of the IAD methods may be performed in the presence of a reactive gas species, such as $O_2$, $N_2$, halogens, etc.

As shown, a plasma resistant ceramic coating 715 is formed on a substrate 710 (e.g., a faceplate or SMD) by an accumulation of deposition materials 702 in the presence of energetic particles 703 such as ions. The deposition materials 702 include atoms, ions, radicals, or their mixture. The energetic particles 703 may impinge and compact the plasma resistant ceramic coating 715 as it is formed.

Figure 7B:
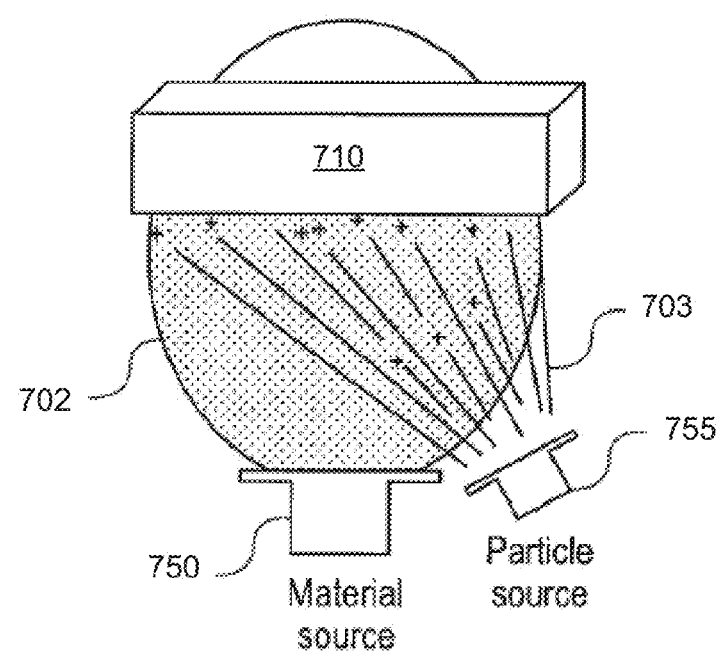
FIG. 7B depicts a schematic of an IAD deposition apparatus.

In one embodiment, IAD is utilized to form the plasma resistant ceramic coating 715, as previously described elsewhere herein. FIG. 7B depicts a schematic of an IAD deposition apparatus. As shown, a material source 750 provides a flux of deposition materials 702 while an energetic particle source 755 provides a flux of the energetic particles 703, both of which impinge upon the material source 750 throughout the IAD process. The energetic particle source 755 may be an Oxygen or other ion source. The energetic particle source 755 may also provide other types of energetic particles such as inert radicals, neutron atoms, and nano-sized particles which come from particle generation sources (e.g., from plasma, reactive gases or from the material source that provide the deposition materials). The material source (e.g., a target body) 750 used to provide the deposition materials 702 may be a bulk sintered ceramic corresponding to the same ceramic that the plasma resistant ceramic coating 715 is to be composed of. For example, the material source may be a bulk sintered ceramic compound body, or bulk sintered $Y_2O_3$, $YF_3$, YAG, $Er_2O_3$, $Gd_2O_3$, $Er_3Al_5O_{12}$, or $Gd_3Al_5O_{12}$. IAD may utilize one or more plasmas or beams to provide the material and energetic ion sources. Reactive species may also be provided during deposition of the plasma resistant coating. In one embodiment, the energetic particles 703 include at least one of non-reactive species (e.g., Ar) or reactive species (e.g., O). In further embodiments, reactive species such as CO and halogens (Cl, F, Br, etc.) may also be introduced during the formation of a plasma resistant coating to further increase the tendency to selectively remove deposited material most weakly bonded to the plasma resistant ceramic coating 715.

With IAD processes, the energetic particles 703 may be controlled by the energetic ion (or other particle) source 755 independently of other deposition parameters. According to the energy (e.g., velocity), density and incident angle of the energetic ion flux, composition, structure, crystalline orientation and grain size of the plasma resistant ceramic coating may be manipulated. Additional parameters that may be adjusted are a temperature of the article during deposition, a pressure used during deposition, and the duration of the deposition. The ion energy may be roughly categorized into low energy ion assist and high energy ion assist. The ions are projected with a higher velocity with high energy ion assist than with low energy ion assist. Substrate (article) temperature during deposition may be roughly divided into low temperature (around 120-150° C. in one embodiment which is typical room temperature) and high temperature (around 270° C. in one embodiment). IAD deposition may be performed using low temperature or high temperature as well as low energy ion assist or high energy ion assist.

In one embodiment, the substrate 710 is at an angle to the material source to cause deposition materials 702 to form on walls of apertures in the substrate 710. In one embodiment, an angle of 10-30 degrees is used. In one embodiment, an angle of 22 degrees is used. The substrate 710 may be rotated and/or otherwise repositioned during deposition to ensure that all walls of apertures in the substrate 710 are coated.

Figure 8:
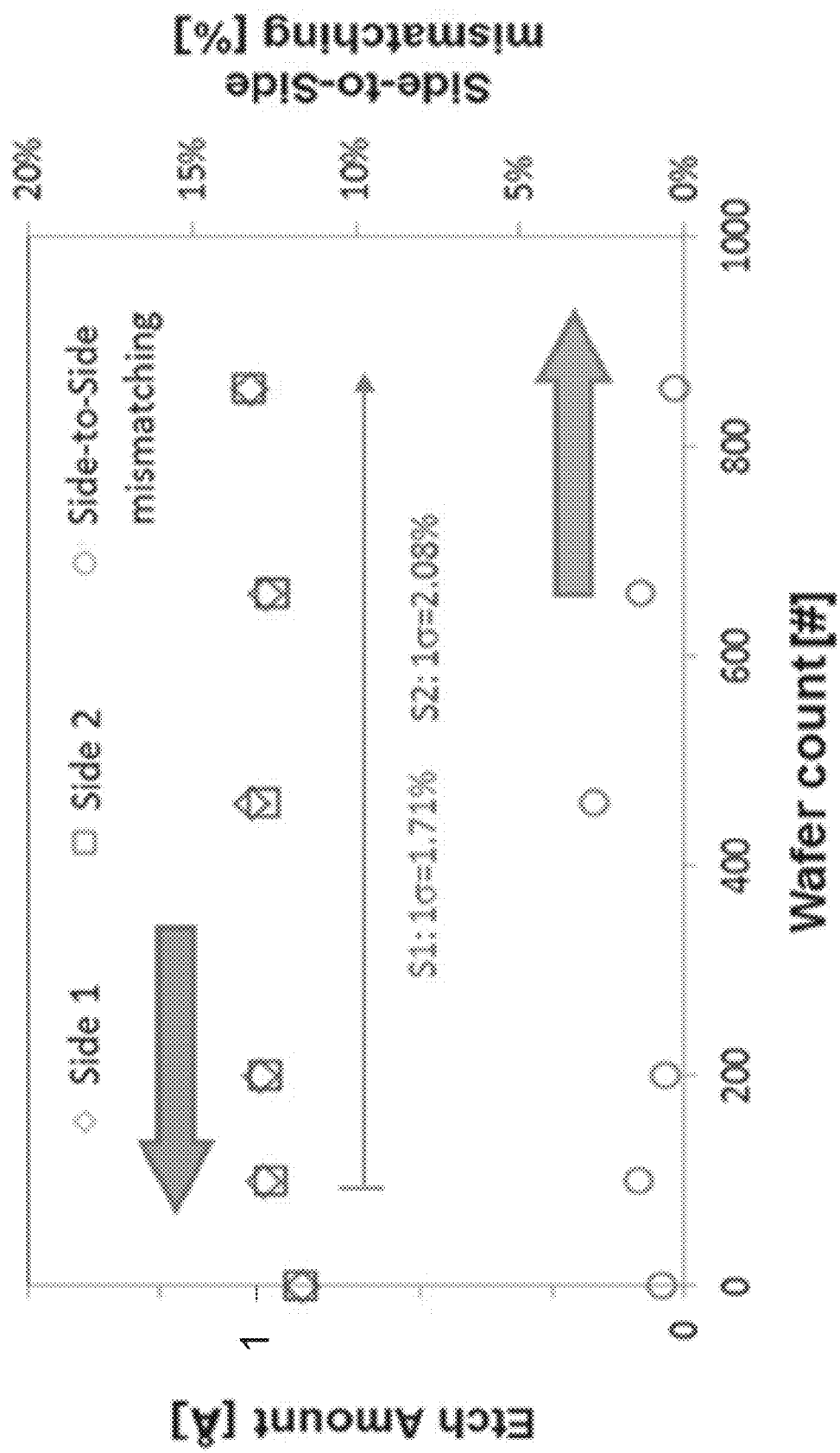
FIG. 8 is a chart showing side-to-side mismatching between different plasma generation chambers formed in accordance with embodiments of the present invention.

FIG. 8 is a chart showing side-to-side mismatching between different plasma generation chambers formed in accordance with embodiments of the present invention. The chart also shows normalized etch rates for a side 1 and a side 2 of a dual chamber etch reactor. Side 1 in the chart is a first process chamber having a first SMD coated with an IAD deposited plasma resistant ceramic coating and a first faceplate coated with an IAD deposited plasma resistant ceramic coating. Side 2 in the chart is a second process chamber having a second SMD coated with an IAD deposited plasma resistant ceramic coating and a second faceplate coated with an IAD deposited plasma resistant ceramic coating. As shown, side-to-side mismatching between process chambers is less than 3% compared to a 30% side-to-side mismatch for process chambers including plasma sprayed SMDs and plasma sprayed faceplates. Accordingly, a mismatch between a layer on a first wafer etched using a first plasma generation chamber manufactured in accordance with an embodiment and a second wafer etched using a second plasma generation chamber manufactured in accordance with an embodiment may have a mismatch of less than 3%.

The preceding description sets forth numerous specific details such as examples of specific systems, components, methods, and so forth, in order to provide a good understanding of several embodiments of the present invention. It will be apparent to one skilled in the art, however, that at least some embodiments of the present invention may be practiced without these specific details. In other instances, well-known components or methods are not described in detail or are presented in simple block diagram format in order to avoid unnecessarily obscuring the present invention. Thus, the specific details set forth are merely exemplary. Particular implementations may vary from these exemplary details and still be contemplated to be within the scope of the present invention.

Reference throughout this specification to "one embodiment" or "an embodiment" means that a particular feature, structure, or characteristic described in connection with the embodiment is included in at least one embodiment. Thus, the appearances of the phrase "in one embodiment" or "in an embodiment" in various places throughout this specification are not necessarily all referring to the same embodiment. In addition, the term "or" is intended to mean an inclusive "or" rather than an exclusive "or." When the term "about" or "approximately" is used herein, this is intended to mean that the nominal value presented is precise within ±10%.

Although the operations of the methods herein are shown and described in a particular order, the order of the operations of each method may be altered so that certain operations may be performed in an inverse order or so that certain operation may be performed, at least in part, concurrently with other operations. In another embodiment, instructions or sub-operations of distinct operations may be in an intermittent and/or alternating manner.

It is to be understood that the above description is intended to be illustrative, and not restrictive. Many other embodiments will be apparent to those of skill in the art upon reading and understanding the above description. The scope of the invention should, therefore, be determined with reference to the appended claims, along with the full scope of equivalents to which such claims are entitled.

What is claimed is:

1. A plasma generation chamber comprising:
    a faceplate having a first plasma resistant ceramic coating on a surface of the faceplate, wherein the first plasma resistant ceramic coating comprises a thickness of less than approximately 30 microns, a porosity of less than 1% and a thickness variation of less than +/−2%;
    a selectivity modulation device (SMD) having a second plasma resistant ceramic coating on a surface of the SMD, wherein the second plasma resistant ceramic coating comprises a thickness of less than approximately 30 microns, a porosity of less than 1% and a thickness variation of less than +/−2%; and
    a dielectric separator separating the faceplate from the selectivity modulation device;
    wherein the plasma generation chamber is to generate plasma for a processing chamber by accelerating radicals from the faceplate toward the SMD and through a plurality of holes in the SMD.

2. The plasma generation chamber of claim 1, wherein the first plasma resistant ceramic coating and the second plasma resistant ceramic coating each have a surface roughness of less than 32 micro-inches and a variation in surface roughness of less than 4 micro-inches.

3. The plasma generation chamber of claim 1, wherein the first plasma resistant ceramic coating and the second plasma resistant ceramic coating each have a variation in thickness of less than 0.4 microns.

4. The plasma generation chamber of claim 1, wherein wafers etched using plasma provided by the plasma generation chamber have a surface thickness variation of approximately 3-5%.

5. The plasma generation chamber of claim 1, wherein the first plasma resistant ceramic coating and the second plasma resistant ceramic coating each comprise at least one of $Y_2O_3$, $Y_3Al_5O_{12}$, $YF_3$, $Y_4Al_2O_9$, $Er_2O_3$, $Gd_2O_3$, $Er_3Al_5O_{12}$, $Gd_3Al_5O_{12}$, $Nd_2O_3$, or a ceramic compound comprising $Y_4Al_2O_9$ and a solid-solution of $Y_2O_3$—$ZrO_2$.

6. The plasma generation chamber of claim 1, wherein:
the faceplate comprises a plurality of apertures, wherein the first plasma resistant ceramic coating coats at least a portion of each of the plurality of apertures in the faceplate, and wherein a thickness of the first plasma resistant coating on walls of the plurality of apertures in the faceplate is approximately 4-15 microns; and
the second plasma resistant ceramic coating coats at least a portion of each of the plurality of apertures in the SMD, wherein a thickness of the second plasma resistant coating on the walls of the plurality of apertures in the SMD is approximately 4-15 microns.

7. An article comprising:
a metal base having a plurality of apertures; and
a plasma resistant ceramic coating on a surface of the metal base, the plasma resistant ceramic coating having a thickness of approximately 5-30 microns on a surface of the article and a thickness of approximately 1-15 microns on walls of the plurality of apertures, the plasma resistant ceramic coating further having a porosity of less than 1% on the surface of the article and on the walls of the plurality of apertures and a thickness variation of less than +/−2% on the surface of the metal base.

8. The article of claim 7, wherein the article comprises one of a faceplate or a selectivity modulation device (SMD).

9. The article of claim 8, wherein wafers etched using plasma provided by a plasma generation chamber comprising the faceplate or the SMD have a surface thickness variation of approximately 3-5%.

10. The article of claim 7, wherein the plasma resistant ceramic coating has a surface roughness of approximately 4-8 micro-inches and a variation in surface roughness of less than 4 micro-inches.

11. The article of claim 7, wherein the plasma resistant ceramic coating has a variation in thickness of less than 0.4 microns on the surface of the article.

12. The article of claim 7, wherein the plasma resistant ceramic coating comprises at least one of $Y_2O_3$, $YF_3$, $Y_3Al_5O_{12}$, $Y_4Al_2O_9$, $Er_2O_3$, $Gd_2O_3$, $Er_3Al_5O_{12}$, $Gd_3Al_5O_{12}$, $Nd_2O_3$, or a ceramic compound comprising $Y_4Al_2O_9$ and a solid-solution of $Y_2O_3$—$ZrO_2$.

13. A method comprising:
performing an ion assisted deposition (IAD) process to deposit a first plasma resistant ceramic coating on a surface of a first article having a first plurality of apertures, the plasma resistant ceramic coating having a thickness of approximately 5-30 microns on a surface of the article and a thickness of approximately 2-15 microns on walls of the first plurality of apertures, the first plasma resistant ceramic coating further having a porosity of less than 1% and a thickness variation of less than +/−2% on the surface of the article, wherein the article is one of a faceplate and a selectivity modulation device (SMD).

14. The method of claim 13, wherein the IAD process is performed at a pressure of 10-500 mTorr, and wherein the IAD process at the pressure is a semi-line-of-sight process that coats an entirety of the walls of the first plurality of apertures, including portions of the walls that are outside a line-of-sight of a deposition source.

15. The method of claim 14, further comprising:
performing the IAD process to deposit a second plasma resistant ceramic coating on a surface of a second article having a second plurality of apertures, the second article comprising a second one of the faceplate and the SMD, the second plasma resistant ceramic coating having a thickness of approximately 5-30 microns on a surface of the second article and a thickness of approximately 1-15 microns on walls of the second plurality of apertures, the second plasma resistant ceramic coating further having a porosity of less than 1% and a thickness variation of less than +/−2% on the surface of the second article.

16. The method of claim 15, further comprising:
assembling a plasma generation chamber comprising the faceplate and the SMD, wherein wafers etched using plasma provided by the plasma generation chamber have a surface thickness variation of less than 5%.

17. The method of claim 16, further comprising:
assembling a second plasma generation chamber comprising a second faceplate having a third plasma resistant ceramic coating and a second SMD having a fourth plasma resistant ceramic coating, the third plasma resistant ceramic coating and fourth plasma resistant ceramic coating each having a thickness of approximately 5-30 microns on surfaces of the second faceplate and the second SMD, a porosity of less than 1% and a thickness variation of less than +/−2% on the surfaces of the second faceplate and the second SMD;
wherein an average thickness mismatch between a layer on a first wafer etched using the first plasma generation chamber with an etch recipe and a second layer on a second wafer etched using the second plasma generation chamber and the etch recipe is less than 5%.

18. The method of claim 13, wherein the first plasma resistant ceramic coating has a surface roughness of approximately 4-8 micro-inches, a variation in surface roughness of less than 4 micro-inches, and a variation in thickness of less than 0.4 microns on the surface of the first article.

19. The method of claim 13, further comprising:
polishing the surface of the first article and the walls of the first plurality of apertures to a roughness of approximately 4-8 micro-inches prior to performing the IAD process.

20. The method of claim 13, wherein the first plasma resistant ceramic coating comprises at least one of $Y_2O_3$, $YF_3$, $Y_3Al_5O_{12}$, $Y_4Al_2O_9$, $Er_2O_3$, $Gd_2O_3$, $Er_3Al_5O_{12}$, $Gd_3Al_5O_{12}$, $Nd_2O_3$, or a ceramic compound comprising $Y_4Al_2O_9$ and a solid-solution of $Y_2O_3$—$ZrO_2$.

* * * * *